(12) United States Patent
Wieduwilt et al.

(10) Patent No.: US 11,948,657 B2
(45) Date of Patent: Apr. 2, 2024

(54) SENSE AMPLIFIER LAYOUT DESIGNS AND RELATED APPARATUSES AND METHODS

(71) Applicant: Micron Technology, Inc., Boise, ID (US)

(72) Inventors: Christopher G. Wieduwilt, Boise, ID (US); Eric J. Schultz, Boise, ID (US)

(73) Assignee: Micron Technology, Inc., Boise, ID (US)

(*) Notice: Subject to any disclaimer, the term of this patent is extended or adjusted under 35 U.S.C. 154(b) by 61 days.

(21) Appl. No.: 17/547,574

(22) Filed: Dec. 10, 2021

(65) Prior Publication Data

US 2023/0186956 A1 Jun. 15, 2023

(51) Int. Cl.
| | |
|---|---|
| G11C 7/06 | (2006.01) |
| G11C 7/08 | (2006.01) |
| G11C 7/12 | (2006.01) |
| H01L 27/088 | (2006.01) |
| G06F 30/392 | (2020.01) |

(52) U.S. Cl.
CPC ............... G11C 7/062 (2013.01); G11C 7/08 (2013.01); G11C 7/12 (2013.01); H01L 27/0886 (2013.01); G06F 30/392 (2020.01)

(58) Field of Classification Search
CPC .. G11C 7/062; G11C 7/08; G11C 7/12; H01L 27/0886; G06F 30/392
USPC ........................................................ 365/203
See application file for complete search history.

(56) References Cited

U.S. PATENT DOCUMENTS

| | | | |
|---|---|---|---|
| 10,535,665 B1* | 1/2020 | Imamoto | ............. H01L 29/4966 |
| 2014/0104918 A1* | 4/2014 | Castro | .................... G11C 5/025 |
| | | | 365/230.06 |
| 2015/0055426 A1* | 2/2015 | Chen | ...................... G11C 7/065 |
| | | | 365/207 |

FOREIGN PATENT DOCUMENTS

EP 2518727 A1 * 10/2012 ......... G11C 11/4091

* cited by examiner

*Primary Examiner* — Huan Hoang
(74) *Attorney, Agent, or Firm* — TraskBritt

(57) ABSTRACT

Sense amplifier layout designs and related apparatuses and methods. An apparatus includes a cross-coupled pair of pull-up transistors of a sense amplifier, a cross-coupled pair of pull-down transistors of the sense amplifier, and a pair of conductive lines electrically connecting the cross-coupled pair of pull-up transistors to the cross-coupled pair of pull-down transistors. The apparatus also includes a sense amplifier control transistors sharing a continuous active material with one of the cross-coupled pair of pull-up transistors or the cross-coupled pair of pull-down transistors. A method includes asserting a shared control gate terminal of sense amplifier control transistors sharing a continuous active material with the cross-coupled pair of pull-down transistors, applying a pre-charge voltage potential to the pair of conductive lines, electrically connecting memory cells to the pre-charged pair of bit lines, and amplifying electrical charges delivered to the pair of bit lines by the memory cells.

19 Claims, 10 Drawing Sheets

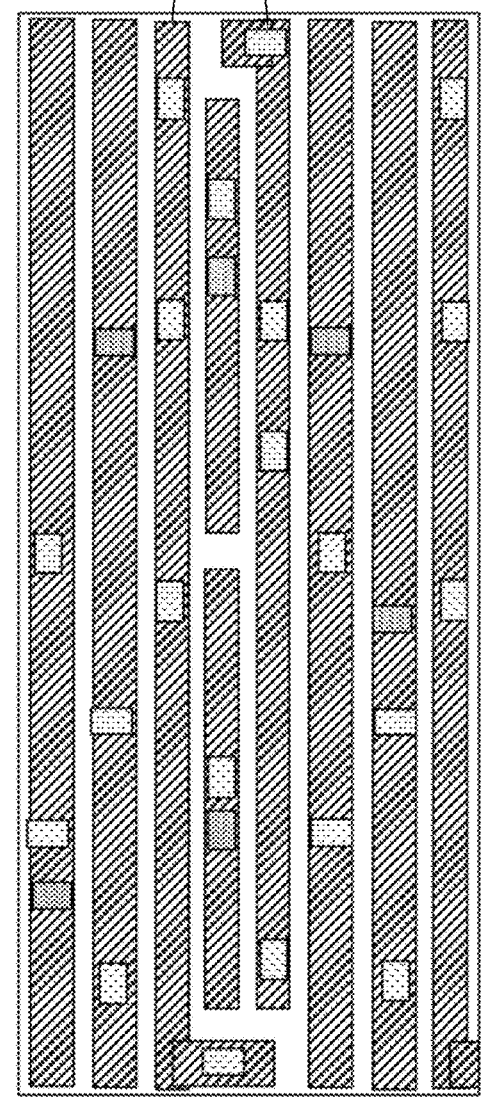
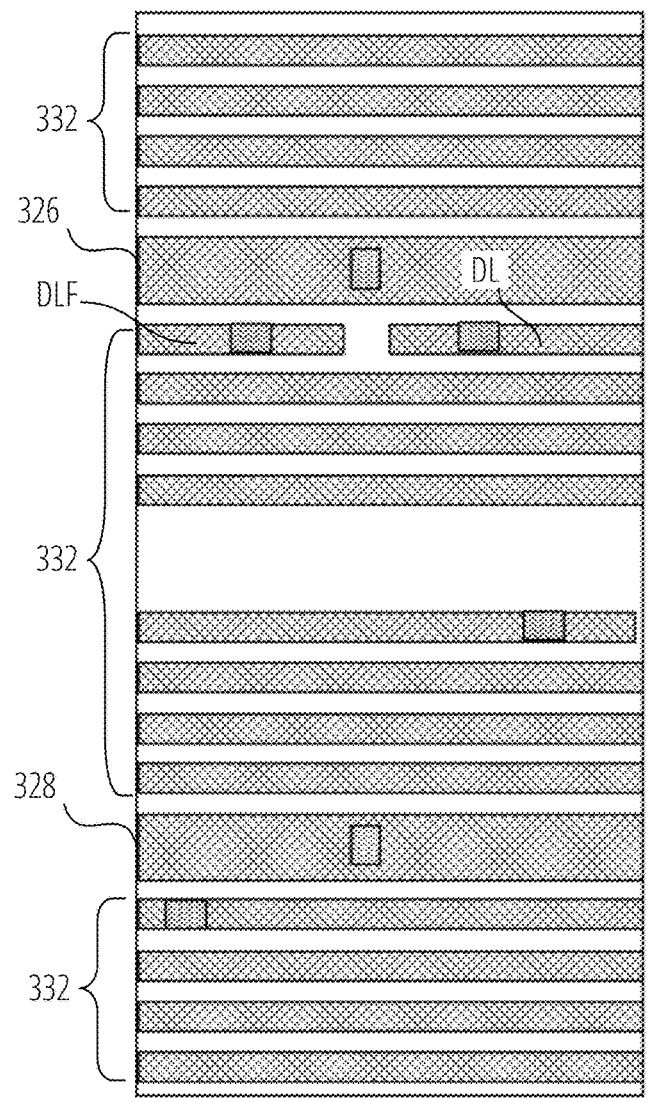
FIG. 4C
FIG. 4D

SENSE AMPLIFIER LAYOUT DESIGNS AND RELATED APPARATUSES AND METHODS

TECHNICAL FIELD

This disclosure relates generally to sense amplifier layout designs, and more specifically to sense amplifier layout designs involving sense amplifier control transistors that share a continuous active material with a cross-coupled pair of transistors.

BACKGROUND

Demand for ever smaller integrated circuit devices has driven semiconductor device designers to use minimum pitch and spacing of devices within integrated circuit devices. Entities that govern standards for the design of these integrated circuit devices hold integrated circuit device designers to various requirements. These requirements may, in many cases, be limiting factors as to how small a given integrated circuit device may be.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 4B, FIG. 4C, and FIG. 4D illustrate the interconnect materials of FIG. 3B, FIG. 3C, and FIG. 3D for the sub-portion of the integrated circuit device portion of FIG. 3A;

DETAILED DESCRIPTION

Figure 1:
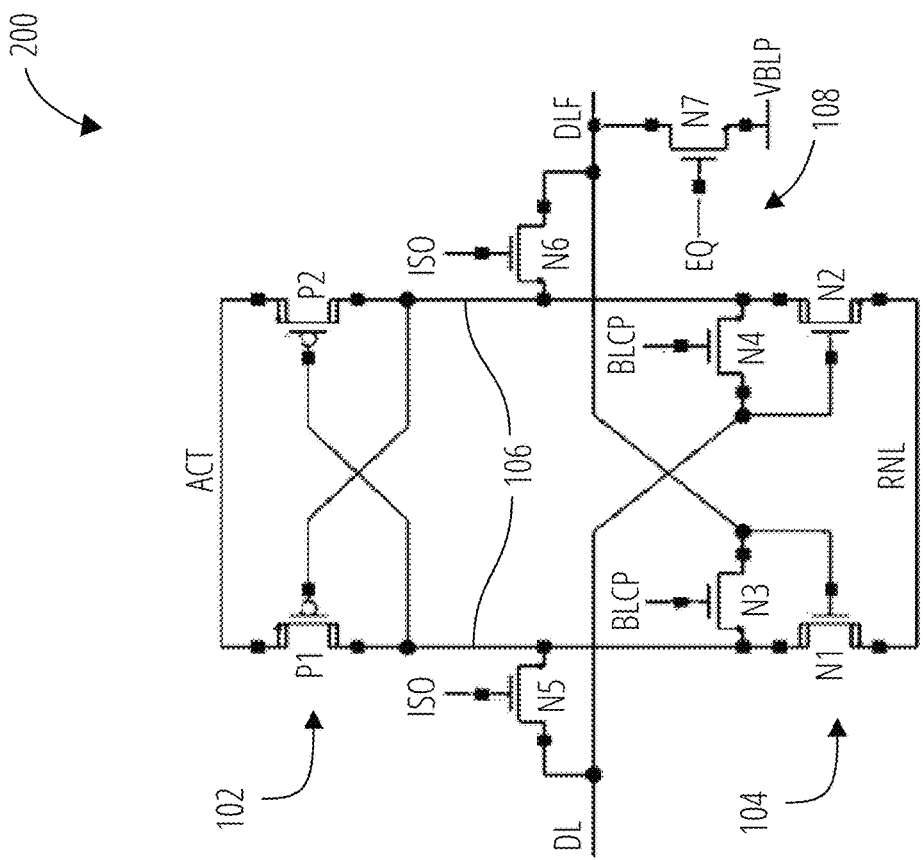
FIG. 1 is a schematic illustration of an example of a sense amplifier, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "conductive material" refers to materials having an electrical conductivity of greater than substantially $10^4$ S/cm ($10^6$ S/m) at room temperature (substantially 20 degrees centigrade). Examples of conductive materials include metals (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), alloys (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), metal-containing materials (e.g., a conductive metal nitride, a conductive metal silicide, a conductive metal carbide, a conductive metal oxide), conductively-doped semiconductor materials (e.g., conductively-doped polysilicon, conductively-doped germanium (Ge), conductively-doped silicon germanium (SiGe)), or combinations thereof. In addition, a "conductive structure" refers a structure formed of and including conductive material.

As used herein, the term "insulative material" refers to materials having an electrical conductivity of less than substantially $10^{-8}$ Siemens per centimeter (S/cm) at room temperature. Examples of insulative materials include at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), at least one dielectric carboxynitride material (e.g., a silicon carboxynitride ($SiO_xC_zN_y$)), or combinations thereof. Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Semiconductor devices often include crystalline semiconductor materials. By way of non-limiting examples, transistors and diodes include crystalline semiconductor materials.

As used herein, the term "monocrystalline semiconductor material" refers to a semiconductor material including particles (e.g., atoms, molecules) that are arranged in a substantially continuous crystal lattice that is substantially free of grain boundaries within the semiconductor material. A substrate of a semiconductor material may include a monocrystalline semiconductor material such as single-crystal silicon. A substrate including monocrystalline semiconductor material may serve as a substrate material for various devices and structures disclosed herein.

As used herein, the term "polycrystalline semiconductor material" refers to a semiconductor material including multiple crystals, sometimes known as crystallites or grains, of the semiconductor material. In contrast with monocrystalline semiconductor material, polycrystalline semiconductor material includes grain boundaries within the semiconductor material. Polycrystalline silicon, which is also known as "polysilicon" and "poly," is an example of a polycrystalline semiconductor material.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "active material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As used herein, the term "continuous active material" refers to an uninterrupted structure formed of and including active material without intervening structures of other materials completely isolating or segmenting off portions of the continuous active material. For example, multiple FinFETs sharing a continuous active material may share a common fin extending through the multiple FinFETs.

FinFETs are examples of MOSFET transistors that include fin-shaped active materials, or "fins," and gate materials on at least two sides of the fins. Some FinFETs include gate materials on three sides of the fins, such as on lateral and top sides of the fins. In general, FinFETs may be smaller (e.g., occupy less chip area) than planar transistors. Accordingly, FinFETs may be used to help meet the continual demand of smaller and smaller integrated circuit devices.

Entities governing standards for manufacturing various integrated circuit devices may require unique restrictions for layout and process of integrated circuit devices including FinFETs. One specific type of integrated circuit device design that may be affected by such unique restrictions is a dynamic random access memory (DRAM) integrated circuit device including complementary metal oxide semiconductor (CMOS) pitch cells. For example, standards governing such DRAM integrated circuit device designs may prohibit the use of polysilicon contacts over active gate (COAG) materials. As a result, rather than design contacts for gate materials directly over the active material of a transistor, the gate material is extended away from the active material into otherwise usable chip area where a contact is made to the gate material. For cells with many small devices, it may be particularly difficult to achieve a small chip area given this COAG prohibition because a relatively large amount of chip area is occupied by contacts to gate materials. As another example, standards governing DRAM integrated circuit device designs may require that fins of FinFETS all extend in parallel with each other across an entire semiconductor die. These standards may also require that gate material lines (e.g., polysilicon lines) extend all in one direction, but in a direction that is perpendicular to the fins of the FinFETs. As a result, bidirectional gate material lines may not be used, which may compound the layout design difficulties resulting from the COAG prohibition. As a further non-limiting example, standards governing DRAM integrated circuit device designs may require single or double diffusion breaks for active isolation in the fin direction. Conductive material lines of these diffusion breaks may occupy chip area that might otherwise be used to reduce chip size or include additional devices. As a result, sense amplifier design layouts including FinFETS following these restrictions may occupy more area than sense amplifier designs including planar transistors.

Designing a layout for sense amplifiers of DRAM memory devices may be particularly difficult in view of these requirements due to the particular complexity of sense amplifiers. Not only may sense amplifiers include two pairs of cross-coupled transistors (e.g., a cross-coupled pair of pull-up transistors and a cross-coupled pair of pull-down transistors), sense amplifiers may include additional transistors. By way of non-limiting example, sense amplifiers may include sense amplifier control transistors used to pre-charge bit lines prior to accessing memory cells electrically connected to the bit lines. If each one of these transistors includes a gate contact that is offset from the active material of the transistor in areas of the chip that would otherwise be usable, a significant area penalty may result. This area may also be compounded by requirements for all parallel gate materials that are perpendicular to all parallel active materials (e.g., fins).

In a non-rotated sense amplifier configuration (transistor gate material lines substantially parallel with bit lines of DRAM memory) following the COAG prohibition, the requirement for parallel fins, and the requirement for parallel gate materials that are perpendicular to the fins, the fins may be pitched to the array in a sub-word driver (SWD) and the gate material lines may be pitched to the array in the sense amplifier. Such a non-rotated configuration, however, may result in a relatively large number of gate material line contacts. The non-rotated configuration may also be sensitive to the prohibition against COAG, and may require single diffusion barrier active isolation, which is generally considered less desirable than double diffusion barrier active isolation. Furthermore, the non-rotated configuration may not be scaled past 160s.

By contrast, in a rotated sense amplifier configuration (transistor gate material lines substantially perpendicular to bit lines of the DRAM memory), the gate material lines may be pitched to the array in the SWD and the fins may be pitched to the array in the sense amplifier. The rotated sense amplifier, however, may also result in a relatively large number of poly contacts, and may be sensitive to the prohibition against COAG (sense amplifier pitch and height are increased). Although double diffusion barrier isolation may be used, double diffusion barrier isolation may result in substantially a 30% larger chip area consumption than single diffusion barrier active isolation. The rotated sense amplifier configuration may be associated with weaker scaling path. In addition, the rotated sense amplifier configuration may force design of a larger SWD than the non-rotated sense amplifier configuration.

According to various embodiments, hybrid rotated sense amplifier configurations mitigate some of the chip area penalties associated with the COAG prohibition, the requirement for parallel fins, the requirement for parallel gate materials (e.g., poly lines) that are perpendicular to the fins, and the requirement for diffusion breaks for active materials. Conductive lines electrically connecting drain terminals of cross-coupled pairs of pull-up transistors to drain terminals of cross-coupled pairs of pull-down transistors may extend perpendicularly to bit lines (like a rotated sense amplifier), but gate material lines may extend in parallel with the bit lines (like a non-rotated sense amplifier). This combination of rotated and non-rotated sense amplifier features results in hybrid rotated sense amplifiers according to various embodiments disclosed herein.

In some embodiments, continuous active materials may be shared between transistors of a sense amplifier (sometimes referred to as "shared active material," "shared fin," or "shared diffusion"), gate material lines may be shared between transistors of different sense amplifiers (sometimes referred to as "shared poly"), and source terminals of cross-coupled pairs of transistors may be shared between cross-coupled pairs of different sense amplifiers (sometimes referred to herein as "shared RNL" or "shared ACT"). The sharing of these features may result, in some embodiments, to substantially 15% reductions in area consumption of sense amplifier device layouts as compared to those for non-rotated and rotated sense amplifier configurations. If both the COAG prohibition and double diffusion barrier isolation are required, sense amplifiers according to various embodiments disclosed herein may occupy over 40% less area than non-rotated and rotated sense amplifier configurations.

The sharing of gate material lines between sense amplifier control transistors enables multiple transistors to share a single gate material line contact, which reduces the chip area penalty that would be associated with the use of a gate material contact for each sense amplifier control transistor. As a result, the chip area penalty for the COAG prohibition may be reduced.

The shared diffusion between transistors of a sense amplifier may mitigate some of the area penalty resulting from single and/or double diffusion breaks, and may provide design and/or process benefits by allowing for shared RNL lines and/or shared ACT lines, matched polycut patterns for sense amplifier devices, and performance benefits due to device interconnect done in active material and/or a slotted contact material (e.g., a slotted contact layer).

FIG. 1 is a schematic illustration of an example of a sense amplifier 100, according to some embodiments. The sense amplifier 100 is configured to amplify electrical charges delivered by memory cells to a pair of bit lines DL, DLF, which are electrically connected to the sense amplifier 100. The sense amplifier 100 includes a cross-coupled pair of pull-up transistors 102, a cross-coupled pair of pull-down transistors 104, a pair of conductive lines 106, and sense amplifier control transistors 108. The pair of conductive lines 106 electrically connect the cross-coupled pair of pull-up transistors 102 to the cross-coupled pair of pull-down transistors 104.

In some embodiments the sense amplifier control transistors 108 share a continuous active material with one of the cross-coupled pair of pull-up transistors 102 or the cross-coupled pair of pull-down transistors 104, as will be discussed in more detail below. In some embodiments the sense amplifier control transistors 108 share the continuous active material with the cross-coupled pair of pull-up transistors 102. In such embodiments, the sense amplifier control transistors 108 may be implemented using PMOS transistor instead of NMOS transistors so that the sense amplifier control transistors 108 would share a common type of active material (P-type active material) with the cross-coupled pair of pull-up transistors 102. In some embodiments the sense amplifier control transistors 108 share the continuous active material with the cross-coupled pair of pull-down transistors 104. In such embodiments the sense amplifier control transistors 108 would be NMOS transistors, as illustrated in FIG. 1. In some embodiments some of the sense amplifier control transistors 108 may be NMOS transistors and may share a continuous active material with the cross-coupled pair of pull-down transistors 104 and some others of the sense amplifier control transistors 108 may be PMOS transistors and share a continuous active material with the cross-coupled pair of pull-up transistors 102.

Figure 6:
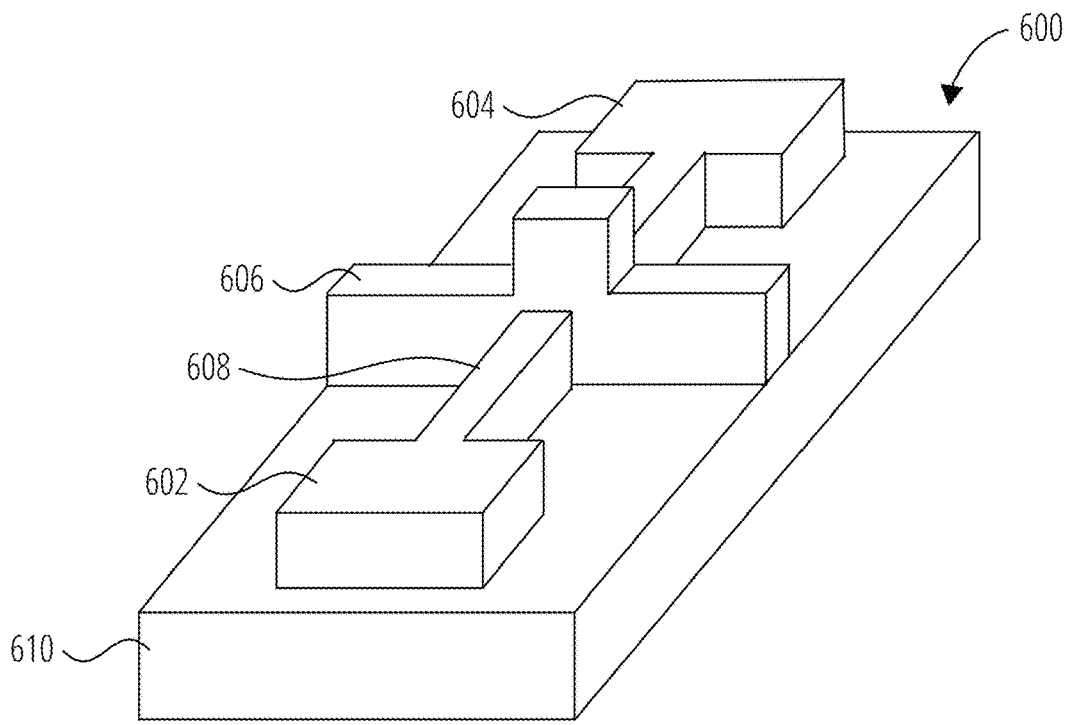
FIG. 6 is a perspective view of a fin field effect transistor (FinFET), according to some embodiments.
Figure 7:
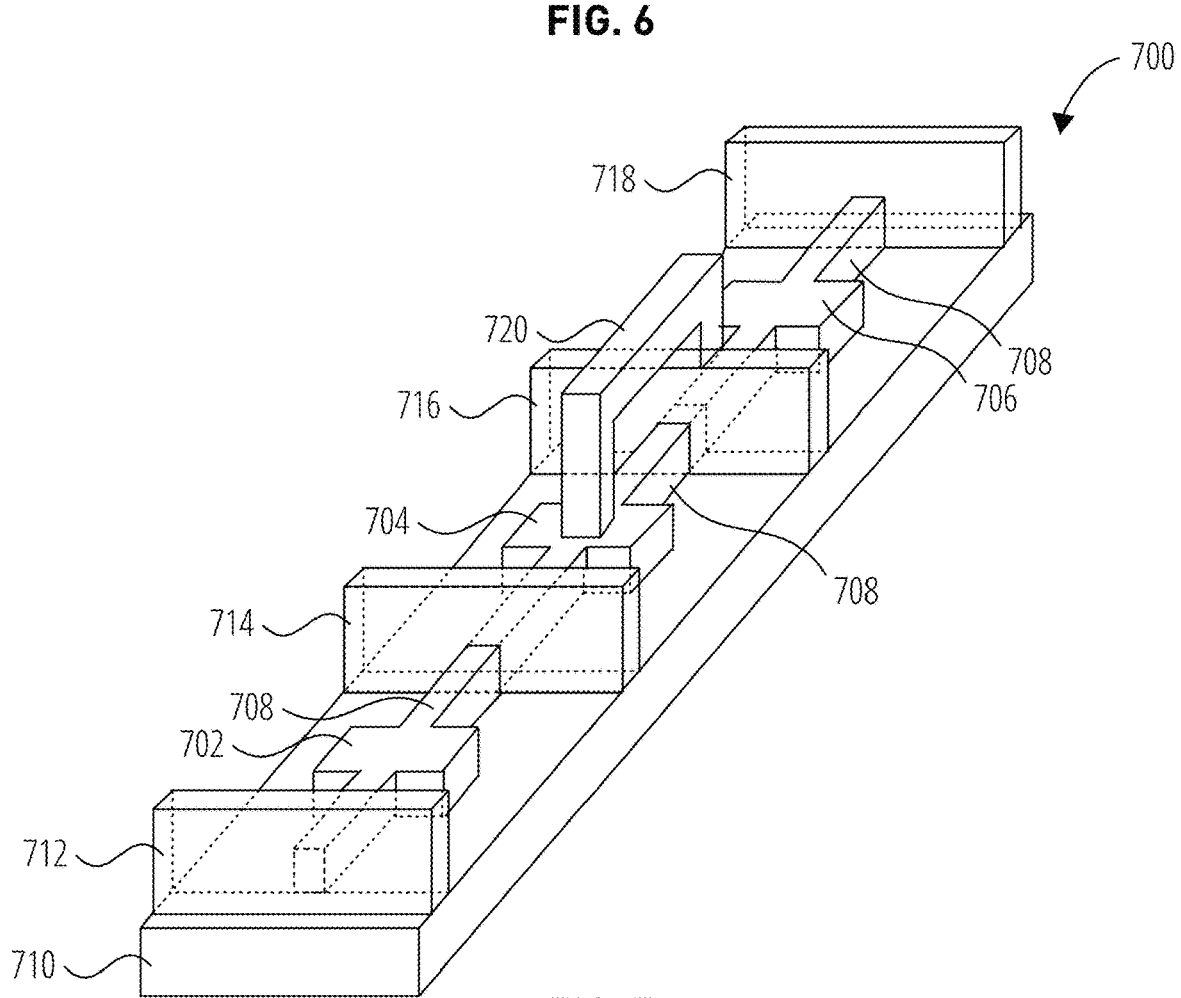
FIG. 7 is a perspective view of FinFETs sharing a continuous active material, according to some embodiments.

In some embodiments the cross-coupled pair of pull-up transistors 102 and the cross-coupled pair of pull-down transistors 104 are FinFETs (see FIG. 6 and FIG. 7). In some embodiments the sense amplifier control transistors 108 are FinFETs and the sense amplifier control transistors 108 share a common fin with the cross-coupled pair of pull-down transistors 104. In some embodiments the cross-coupled pair of pull-up transistors 102 share a common fin. In some embodiments the cross-coupled pair of pull-up transistors 102, the cross-coupled pair of pull-down transistors 104, and the sense amplifier control transistors 108 may be planar transistors.

In some embodiments gate material lines of control gate terminals of the sense amplifier control transistors 108 are shared with other control gate terminals of other sense amplifier control transistors of other sense amplifiers. In some embodiments the gate material lines of the control gate terminals of the sense amplifier control transistors 108 extend at least substantially perpendicularly to the pair of conductive lines 106. In some embodiments the pair of conductive lines 106 extends at least substantially in parallel with a continuous active material the sense amplifier control transistors 108 shares with one of the cross-coupled pair of pull-up transistors 102 or the cross-coupled pair of pull-down transistors 104.

In some embodiments the cross-coupled pair of pull-down transistors 104 include source terminals that are electrically connected to other source terminals of other cross-coupled pairs of pull-down transistors of other sense amplifiers. In some embodiments the cross-coupled pair of pull-up transistors 102 include source terminals that are electrically connected to other source terminals of other cross-coupled pairs of pull-up transistors of other sense amplifiers.

The cross-coupled pair of pull-up transistors 102 includes a first PMOS transistor P1 and a second PMOS transistor P2. The cross-coupled pair of pull-down transistors 104 includes a first NMOS transistor N1 and a second NMOS transistor N2. The pair of conductive lines 106 electrically connect a drain terminal of the first PMOS transistor P1 to a drain terminal of the first NMOS transistor N1, and a drain terminal of the second PMOS transistor P2 to a drain terminal of the second NMOS transistor N2. Source terminals of the first PMOS transistor P1 and the second PMOS transistor P2 are electrically connected together at node ACT of FIG. 1. Similarly, source terminals of the first NMOS transistor N1 and the second NMOS transistor N2 are electrically connected together at node RNL of FIG. 1. A gate terminal of the first PMOS transistor P1 is electrically connected to the drain terminals of the second PMOS transistor P2 and the second NMOS transistor N1. A gate terminal of the second PMOS transistor P2 is electrically connected to the drain terminals of the first PMOS transistor P1 and the first NMOS transistor N1. A gate terminal of the first NMOS transistor N1 is electrically connected to bit line DLF. A gate terminal of the second NMOS transistor N2 is electrically connected to bit line DL.

The sense amplifier control transistors 108 may be used to pre-charge the sense amplifier 100 and the bit lines DL, DLF electrically connected thereto prior to accessing memory cells electrically connected to the bit lines DL, DLF. The sense amplifier control transistors 108 include a third NMOS transistor N3, a fourth NMOS transistor N4, a fifth NMOS transistor N5, and sixth NMOS transistor N6. The third NMOS transistor N3 is electrically connected between bit line DLF and the drain terminals of the first NMOS transistor N1 and the first PMOS transistor P1. In other words, the third NMOS transistor N3 is electrically connected from the gate terminal of the first NMOS transistor N1 to one of the pair of conductive lines 106 that connects the drain terminals of the first NMOS transistor N1 and the first PMOS transistor P1. The fourth NMOS transistor N4 is electrically connected from bit line DL to the drain terminals of the second NMOS transistor N2 and the second PMOS transistor P2. In other words, the fourth NMOS transistor N4 is electrically connected from the gate terminal of the second NMOS transistor N2 to one of the pair of conductive lines 106 that connects the drain terminals of the second NMOS transistor N2 and the second PMOS transistor P2.

Gate terminals of the third NMOS transistor N3 and the fourth NMOS transistor N4 are electrically connected to a pre-charge control node BLCP. Accordingly, responsive to an assertion of a pre-charge control voltage potential at the pre-charge control node BLCP, the third NMOS transistor N3 may electrically connect the gate terminal of the first NMOS transistor N1 and the bit line DLF to the one of the pair of conductive lines 106 that is electrically connected to the drain terminals of the first PMOS transistor P1 and the first NMOS transistor N1. Also, responsive to the assertion of the pre-charge control voltage potential at the pre-charge control node BLCP, the fourth NMOS transistor N4 may electrically connect the gate terminal of the second NMOS transistor N2 and the bit line DL to the one of the pair of conductive lines 106 that is electrically connected to the drain terminals of the second PMOS transistor P2 and the second NMOS transistor N2.

The fifth NMOS transistor N5 is electrically connected between bit line DL and the one of the pair of conductive lines 106 that is electrically connected to the drain terminals of the first PMOS transistor P1 and the first NMOS transistor N1. The sixth NMOS transistor N6 is electrically connected between bit line DLF and the one of the pair of conductive lines 106 that is electrically connected to the drain terminals of the second PMOS transistor P2 and the second NMOS transistor N2. Gate terminals of the fifth NMOS transistor N5 and the sixth NMOS transistor N6 are electrically connected to an isolation node ISO. Accordingly, responsive to an assertion of an isolation voltage potential at the isolation node ISO, the fifth NMOS transistor is configured to electrically connect the bit line DL to the one of the pair of conductive lines 106 that is electrically connected to the drain terminals of the first PMOS transistor P1 and the first NMOS transistor N1. Also, responsive to the assertion of the isolation voltage potential at the isolation node ISO, the sixth NMOS transistor N6 is configured to electrically connect the bit line DLF to the one of the pair of conductive lines 106 that is electrically connected to the drain terminals of the second PMOS transistor P2 and the second NMOS transistor N2.

The sense amplifier 100 also includes a seventh NMOS transistor N7 electrically connected from a bit line pre-charge voltage potential node VBLP to the one of the pair of conductive lines 106 that is electrically connected to the drains of the second PMOS transistor P2 and the second NMOS transistor N2. A gate terminal of the seventh NMOS transistor N7 is electrically connected to an equalization node EQ. Accordingly, responsive to an assertion of an equalization voltage potential at the equalization node EQ, the seventh NMOS transistor N7 is configured to electrically connect the bit line pre-charge voltage potential node VBLP to the one of the one of the pair of conductive lines 106 that is electrically connected to the drain terminals of the second PMOS transistor P2 and the second NMOS transistor N2.

In operation, the bit lines DL, DLF and the pair of conductive lines 106 may be pre-charged to the bit line pre-charge voltage potential prior to accessing memory cells electrically connected to the bit lines DL and DLF. Voltage potentials at the pre-charge control node BLCP, the isolation node ISO, and the equalization node EQ may be asserted to electrically connect the bit lines DL, DLF and the pair of conductive lines 106 to the pre-charge voltage potential node VBLP. Accordingly, the pre-charge voltage potential may be delivered to the bit lines DL, DLF and the pair of conductive lines 106.

Figure 2:
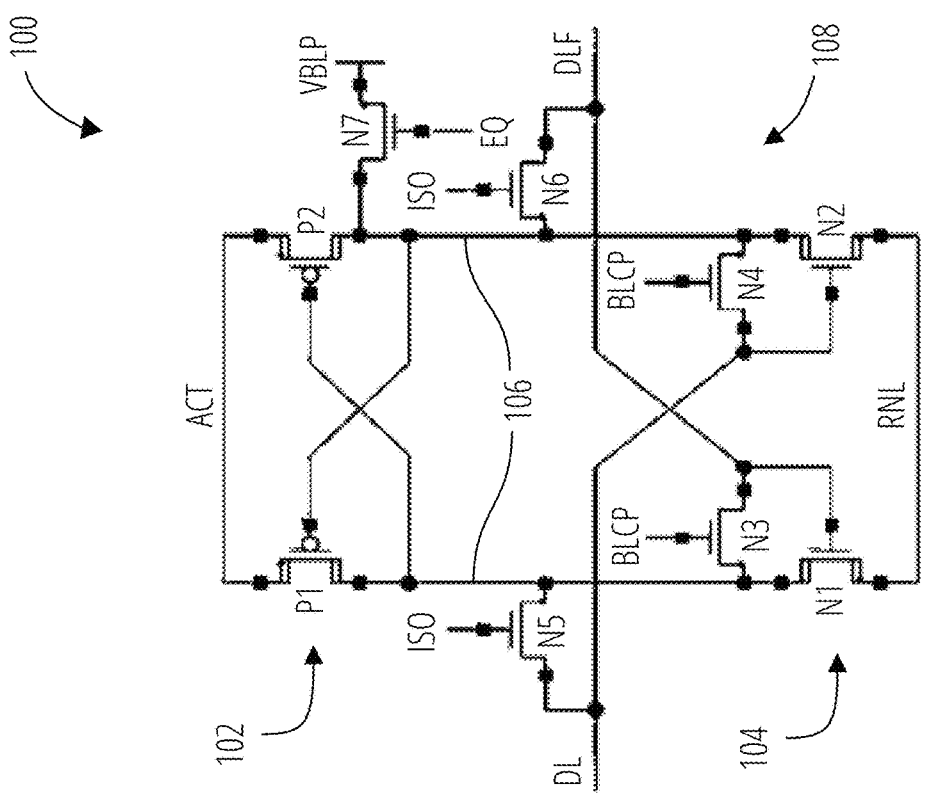
FIG. 2 is a schematic illustration of another example of a sense amplifier, according to some embodiments.

FIG. 2 is a schematic illustration of another example of a sense amplifier 200, according to some embodiments. The sense amplifier 200 includes the cross-coupled pair of pull-up transistors 102, the cross-coupled pair of pull-down transistors 104, the pair of conductive lines 106, the sense amplifier control transistors 108, and the bit lines DL, DLF of the sense amplifier 100 of FIG. 1. In contrast to the sense amplifier 100 of FIG. 1, however, the seventh NMOS transistor N7 is electrically connected from the pre-charge voltage potential node VBLP to bit line DLF.

As discussed with reference to FIG. 1, in operation the bit lines DL, DLF and the pair of conductive lines 106 may be pre-charged to the bit line pre-charge voltage potential prior to accessing memory cells electrically connected to the bit lines DL and DLF. Voltage potentials at the pre-charge control node BLCP, the isolation node ISO, and the equalization node EQ may be asserted to electrically connect the bit lines DL, DLF and the pair of conductive lines 106 to the pre-charge voltage potential node VBLP. Accordingly, the pre-charge voltage potential may be delivered to the bit lines DL, DLF and the pair of conductive lines 106.

The sense amplifier control transistors 108 (N3, N4, N5, and N6) and the seventh NMOS transistor N7 of FIG. 1 and FIG. 2 are NMOS transistors. Accordingly, the sense amplifier control transistors 108 and/or the seventh NMOS transistor N7 may share a continuous active material with the cross-coupled pair of pull-down transistors 104. In some embodiments, however, PMOS transistors may be used in place of the NMOS transistors for one or more of NMOS transistors N3, N4, N5, N6, and N7. In such embodiments, any PMOS transistors may share a continuous active material with the cross-coupled pair of pull-up transistors 102.

Figures 3A, 3B:
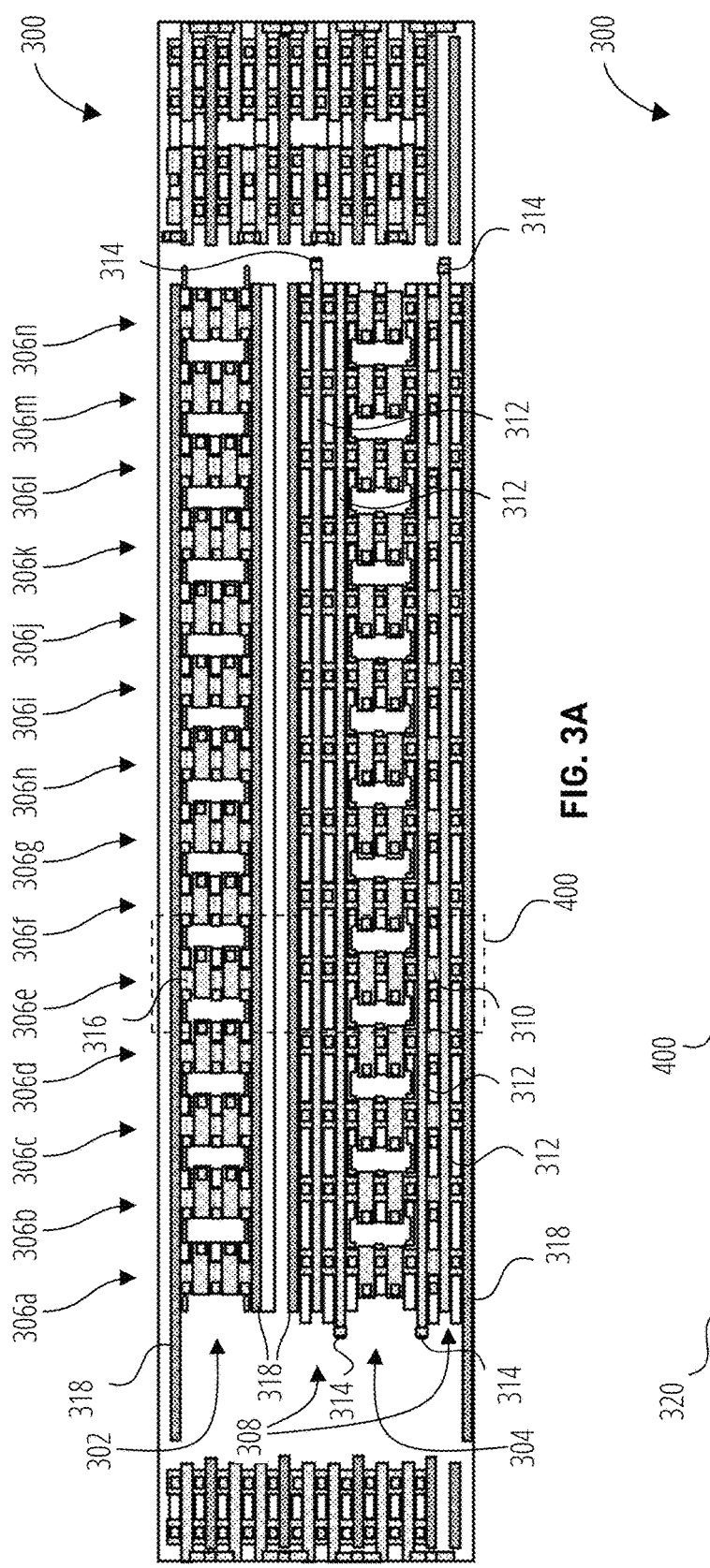
FIG. 3A is a top view of a layout design for an integrated circuit device portion, according to some embodiments.
FIG. 3B, FIG. 3C, and FIG. 3D illustrate interconnect materials for electrically connecting cross-coupled pairs of pull-up transistors, cross-coupled pairs of pull-down transistors, and sets of sense amplifier control transistors of the integrated circuit device portion of FIG. 3A.

FIG. 3A is a top view of a layout design for an integrated circuit device portion 300, according to some embodiments. The integrated circuit device portion 300 includes several sense amplifiers 306a-306n. The example of the integrated circuit device portion 300 illustrated in FIG. 3A illustrates fourteen sense amplifiers 306a-306n. The integrated circuit device portion 300 includes a sub-portion 400 including sense amplifier 306e, which will be discussed in more detail with reference to FIG. 4A, FIG. 4B, FIG. 4C, and FIG. 4D. The integrated circuit device portion 300 includes cross-coupled pairs of pull-up transistors 302, cross-coupled pairs of pull-down transistors 304, and sets of sense amplifier control transistors 308 for the sense amplifiers 306a-306n. Each of the cross-coupled pairs of pull-up transistors 302 may be similar to the cross-coupled pair of pull-up transistors 102 of FIG. 1 and FIG. 2. Also, each of the cross-coupled pairs of pull-down transistors 304 may be similar to the cross-coupled pair of pull-down transistors 104 of FIG. 1 and FIG. 2. Furthermore, each of the sets of sense amplifier control transistors 308 may be similar to the sense amplifier control transistors 108 of FIG. 1 and FIG. 2.

Each of the sets of sense amplifier control transistors 308 shares a continuous active material (e.g., continuous active material 310) with its corresponding one of the cross-coupled pairs of pull-down transistors 304. In other words, for each of the sense amplifiers 306a-306n, a single continuous active material (e.g., a continuous fin for FinFETs) extends uninterrupted through the corresponding one of the cross-coupled pairs of pull-down transistors 304 and the corresponding one of the sets of sense amplifier control transistors 308. By way of non-limiting example, the continuous active material 310 extends through the one of the cross-coupled pairs of pull-down transistors 304 and the one of the sets of sense amplifier control transistors 308 corresponding to sense amplifier 306e.

Gate terminals of each of the sets of sense amplifier control transistors 308 share common gate material lines 312. In other words, the gate material lines 312 extend uninterrupted through each of the sets of sense amplifier control transistors 308. The gate material lines 312 may include conductive material. By way of non-limiting example, the gate material lines 312 may include polycrystalline silicon (polysilicon). Also by way of non-limiting example, the gate material lines 312 may include metals (e.g., tungsten, copper, work function metals, titanium, aluminum, or combinations thereof).

The gate material lines 312 may include gate line contacts 314 to electrically connect the gate material lines 312 to their various control nodes (e.g., the isolation node ISO and the pre-charge control node BLCP of FIG. 1 and FIG. 2). Each one of the gate material lines 312 includes a single one of the gate line contacts 314, which services one transistor of each of the sets of sense amplifier control transistors 308. In the example of FIG. 3A, each one of the gate line contacts 314 provides electrical access to fourteen transistors, which occupies less chip area than an individual gate line contact for each one of the fourteen transistors. As a result, the sharing common gate material lines 312, and by extension the sharing of gate line contacts 314, reduces the area penalty corresponding to the COAG prohibition.

In some embodiments the cross-coupled pairs of pull-up transistors 302 and the cross-coupled pairs of pull-down transistors 304 are FinFETs. The sets of sense amplifier control transistors 308 may also be FinFETs. In such embodiments the sets of sense amplifier control transistors 308 may share common fins (the continuous active materials such as the continuous active material 310) with their corresponding cross-coupled pairs of pull-down transistors 304. Also, each of the cross-coupled pairs of pull-up transistors 302 may share a continuous active material, and in the case of the cross-coupled pairs of pull-up transistors 302 being FinFETs, a common fin (e.g., the continuous active material 316 of sense amplifier 306e).

The integrated circuit device portion 300 may include diffusion breaks 318 at ends of the continuous active materials (e.g., the continuous active material 310 and the continuous active material 316). By way of non-limiting example, the diffusion breaks 318 may include conductive material lines (e.g., polysilicon lines) extending across the sense amplifiers 306a-306n at ends of the continuous active materials. Accordingly, the diffusion breaks 318 may be shared by the sense amplifiers 306a-306n. The diffusion break 318 may extend substantially in parallel with the gate material lines 312.

Figure 3C:
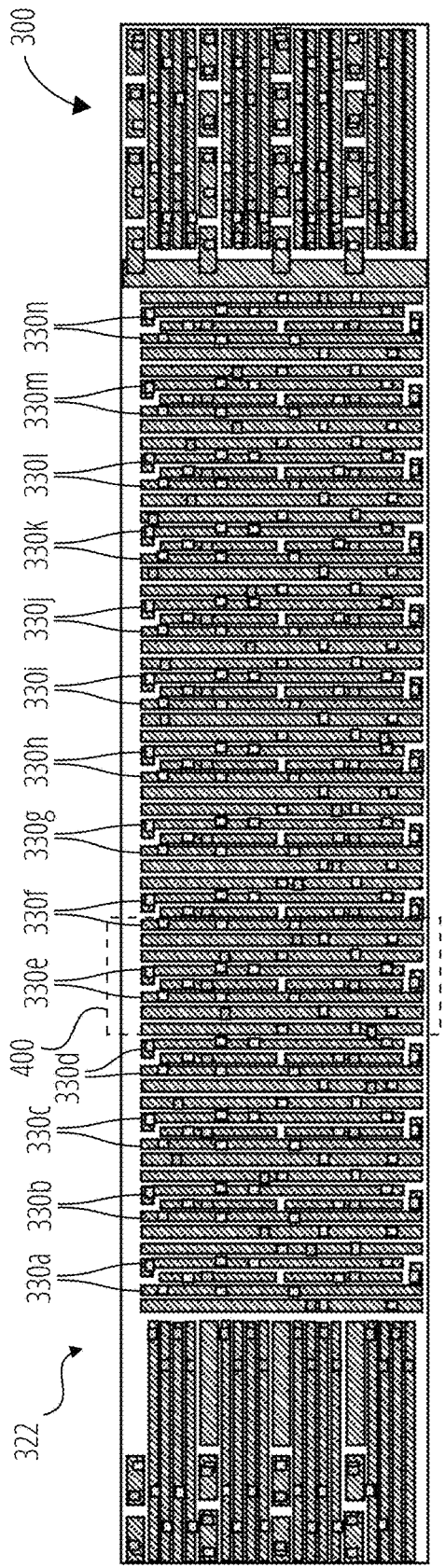
Figure 3D:
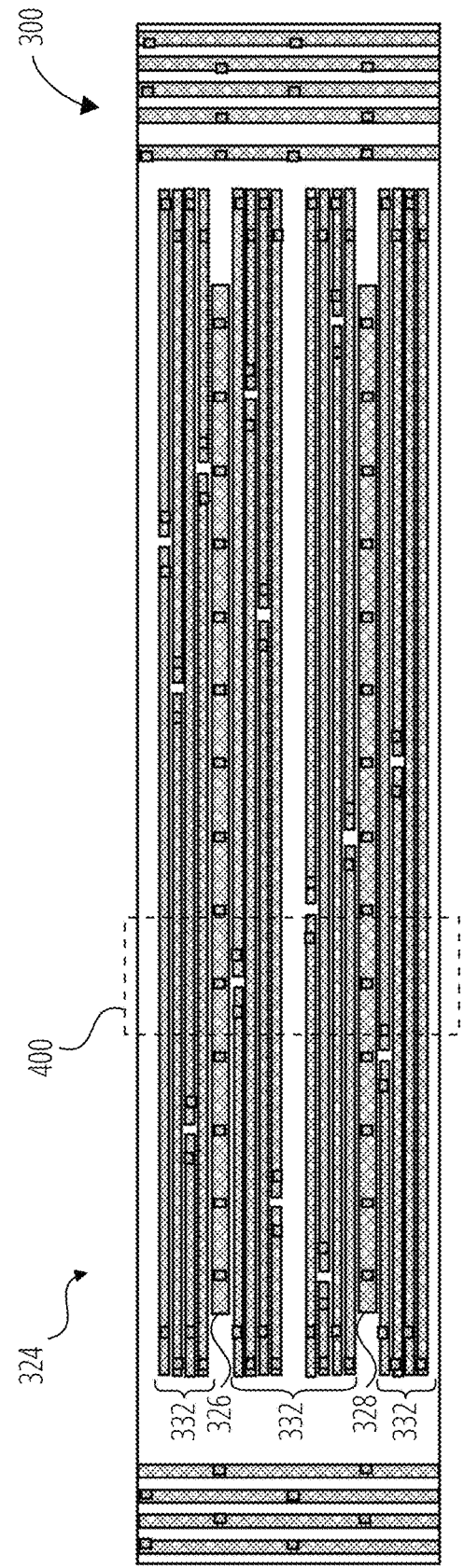

FIG. 3B, FIG. 3C, and FIG. 3D illustrate interconnect materials 320, 322, and 324, respectively, for electrically connecting the cross-coupled pairs of pull-up transistors 302, the cross-coupled pairs of pull-down transistors 304, and the sets of sense amplifier control transistors 308 of the integrated circuit device portion 300 of FIG. 3A. The interconnect material 320 of FIG. 3B includes landing pads and is configured to redistribute contacts (e.g., from devices of FIG. 3A to the interconnect material 322). The interconnect material 322 of FIG. 3C includes vertical device to device connections within each individual sense amplifier 306a-306n and contacts electrically connecting the interconnect material 322 to the interconnect material 320 of FIG. 3B and the interconnect material 324 of FIG. 3D. The interconnect material 324 of FIG. 3D includes bit lines 332 and contacts that electrically connect the interconnect material 324 to the interconnect material 322 of FIG. 3C.

Referring to FIG. 3A, FIG. 3B, FIG. 3C, and FIG. 3D together, the interconnect material 320 of FIG. 3B includes a PMOS source interconnect line 326 electrically connecting source terminals of the cross-coupled pairs of pull-up transistors 302 together. As a result, source terminals of the cross-coupled pairs of pull-up transistors 302 for each of the sense amplifiers 306a-306n are electrically connected together. Similarly, the interconnect material 320 includes an NMOS source interconnect line 328 electrically connecting source terminals of the cross-coupled pairs of pull-down transistors 304 together. As a result, source terminals of the cross-coupled pairs of pull-down transistors 304 for each of the sense amplifiers 306a-306n are electrically connected together. The interconnect material 324 of FIG. 4D also includes the PMOS source interconnect line 326 and the NMOS source interconnect line 328. The PMOS source interconnect line 326 and the NMOS source interconnect line 328 may extend substantially in parallel with the gate material lines 312, the bit lines 332, and materials of the diffusion breaks 318.

The interconnect material 322 of FIG. 3C includes pairs of conductive lines 330a-330n of the sense amplifiers 306a-306n. Each of the pairs of conductive lines 330a-330n may be similar to the pair of conductive lines 106 discussed above with reference to FIG. 1 and FIG. 2. For example, the pairs of conductive lines 330a-330n may electrically connect drain terminals of the cross-coupled pairs of pull-up transistors 302 to drain terminals of the cross-coupled pairs of pull-down transistors 304. The pairs of conductive lines 330a-330n extend at least substantially in parallel with the continuous active materials (e.g., the continuous active material 310 and the continuous active material 316 of sense amplifier 306e). The pairs of conductive lines 330a-330n also extend at least substantially perpendicularly to the gate material lines 312, the materials of the diffusion breaks 318, the PMOS source interconnect line 326, the NMOS source interconnect line 328, and the bit lines 332.

As previously discussed, the interconnect material 324 of FIG. 3D includes the bit lines 332. The interconnect material 324 also includes PMOS source interconnect line 326 and NMOS source interconnect line 328. The bit lines 332, PMOS source interconnect line 326, and the NMOS source interconnect line 328 extend substantially in parallel with the gate material lines 312 and the materials of the diffusion breaks 318. The bit lines 332, PMOS source interconnect line 326, and the NMOS source interconnect line 328 also extend substantially perpendicularly to the continuous active materials (e.g., the continuous active material 310 and the continuous active material 316 of sense amplifier 306e) and the pairs of conductive lines 330a-330n.

In some embodiments an apparatus includes a first sense amplifier including a first cross-coupled pair of pull-up transistors, a first cross-coupled pair of pull-down transistors, and a first set of sense amplifier control transistors sharing a first continuous active material with the first cross-coupled pair of pull-down transistors. The apparatus also includes a second sense amplifier including a second cross-coupled pair of pull-up transistors, a second cross-coupled pair of pull-down transistors, and a second set of sense amplifier control transistors sharing a second continuous active material with the second cross-coupled pair of pull-down transistors.

Figure 4A:
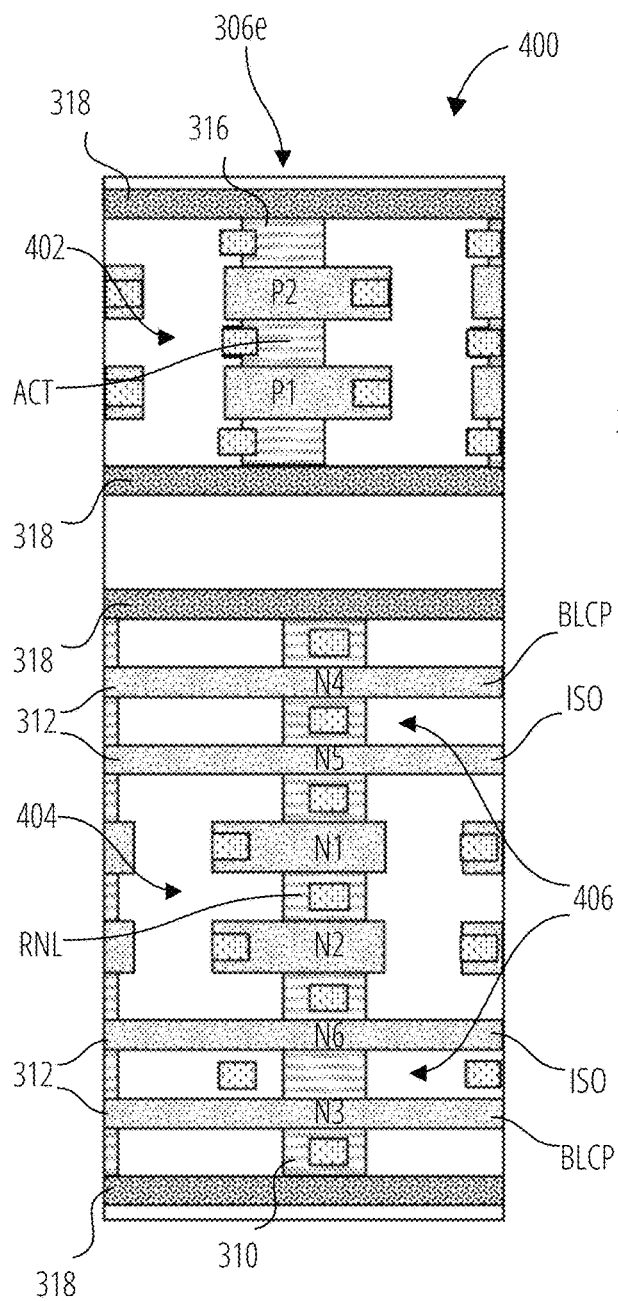
FIG. 4A is a top view of a layout design for a sub-portion of the integrated circuit device portion of FIG. 3A, FIG. 3B, FIG. 3C, and FIG. 3D.

FIG. 4A is a top view of a layout design for the sub-portion 400 of the integrated circuit device portion 300 of FIG. 3A, FIG. 3B, FIG. 3C, and FIG. 3D. The sub-portion 400 includes the sense amplifier 306e of the integrated circuit device portion 300. Each of the sense amplifiers 306a-306n may be similar to the sense amplifier 306e. Sense amplifier 306e, for example, includes a cross-coupled pair of pull-up transistors 402 including a first PMOS transistor P1 and a second PMOS transistor P2. The cross-coupled pair of pull-up transistors 402 may be similar to the cross-coupled pair of pull-up transistors 102 discussed with reference to FIG. 1 and FIG. 2. The sense amplifier 306e also includes a cross-coupled pair of pull-down transistors 404 including a first NMOS transistor N1 and a second NMOS transistor N2. The cross-coupled pair of pull-down transistors 404 may be similar to the cross-coupled pair of pull-down transistors 104 discussed with reference to FIG. 1 and FIG. 2. The sense amplifier 306e further includes sense amplifier control transistors 406 including a third NMOS transistor N3, a fourth NMOS transistor N4, a fifth NMOS transistor N5, and a sixth NMOS transistor N6. The sense amplifier control transistors 406 may be similar to the sense amplifier control transistors 108 discussed with reference to FIG. 1 and FIG. 2.

As discussed with reference to FIG. 1 and FIG. 2, gate terminals of the third NMOS transistor N3 and the fourth NMOS transistor N4 may be electrically connected to a pre-charge control node BLCP. Also, gate terminals of the fifth NMOS transistor N5 and the sixth NMOS transistor N6 may be electrically connected to an isolation node ISO. Furthermore, source terminals of the first PMOS transistor P1 and the second PMOS transistor P2 may be electrically connected together at node ACT. Also, source terminals of the first NMOS transistor N1 and the second NMOS transistor N2 may be electrically connected together at node RNL.

As illustrated in FIG. 4A, the sense amplifier control transistors 406 share the continuous active material 310 (e.g., a common fin for FinFETs, without limitation) with the cross-coupled pair of pull-down transistors 404. If the sense amplifier control transistors 406 were instead PMOS transistors, the sense amplifier control transistors 406 may instead share the continuous active material 316 with the cross-coupled pair of pull-up transistors 402. The cross-coupled pair of pull-up transistors 402 (the first PMOS transistor P1 and the second PMOS transistor P2) share the continuous active material 316 (e.g., a common fin for FinFETs).

The gate material lines 312 of the sense amplifier control transistors 406 are shared with other control gate terminals of other sets of sense amplifier control transistors 308 of other sense amplifiers 306a-306d and 306f-306n (FIG. 3A). As may be seen by comparing FIG. 4A to FIG. 4C, the gate material lines 312 of the control gate terminals of the sense amplifier control transistors 406 extend at least substantially perpendicularly to a pair of conductive lines 330e (FIG. 4C) electrically connecting drain terminals of the cross-coupled pair of pull-up transistors 402 to drain terminals of the cross-coupled pair of pull-down transistors 404. In turn, the pair of conductive lines 330e extend at least substantially perpendicularly to bit lines DL, DLF (FIG. 4D) that the sense amplifier 306e is electrically connected to.

In FIG. 4A some of the contacts (shown as rectangles shaded with vertical broken lines) are shown as off-center from some of the structures they are electrically connected to. It is noted, however, that a contact redistribution material (e.g., a contact redistribution layer, not shown) may be used to electrically connect these off-center contacts with these structures. The contact redistribution material may not be shown in FIG. 4A in the interest of simplicity to more clearly illustrate structures according to various embodiments of the disclosure.

Figure 4B:
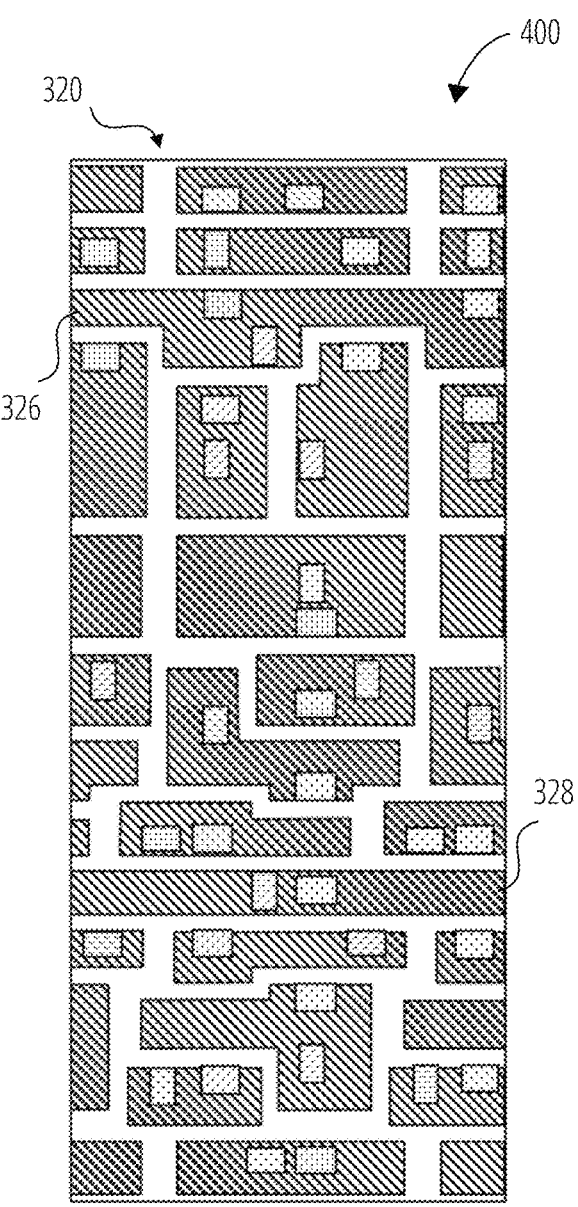

FIG. 4B, FIG. 4C, and FIG. 4D illustrate the interconnect material 320, the interconnect material 322, and the interconnect material 324, respectively, for the sub-portion 400 of the integrated circuit device portion 300 of FIG. 3A. Referring to FIG. 4A, FIG. 4B, FIG. 4C, and FIG. 4D together, the cross-coupled pair of pull-down transistors 404 includes source terminals that are electrically connected, via the NMOS source interconnect line 328 (FIG. 4B and FIG. 4D) to other source terminals of other cross-coupled pairs of pull-down transistors of other sense amplifiers (e.g., the cross-coupled pairs of pull-down transistors 304 of sense amplifiers 306a-306d and sense amplifiers 306f-306n of FIG. 3A). Similarly, the cross-coupled pair of pull-up transistors 402 includes source terminals that are electrically connected to other source terminals of other cross-coupled pairs of pull-up transistors of other sense amplifiers (e.g., the cross-coupled pairs of pull-up transistors 302 of sense amplifiers 306a-306d and sense amplifiers 306f-306n of FIG. 3A).

FIG. 4C illustrates the pair of conductive lines 330e extending in a direction that is at least substantially perpendicularly to the bit lines DL, DLF (FIG. 4D) the sense amplifier 306e (FIG. 4A) is electrically connected to. Also, the pair of conductive lines 330e extends at least substantially in parallel with the continuous active material (the continuous active material 310 and the continuous active material 316 of FIG. 4A) of the sense amplifier 306e.

FIG. 3D illustrates the bit lines 332 (e.g., including the bit lines DL, DLF that the sense amplifier 306e is electrically connected to). The bit lines DL, DLF are electrically connected to the sense amplifier 306e via the interconnect material 324 (FIG. 3D), the interconnect material 322 (FIG. 3C), and the interconnect material 320 (FIG. 3B). Others of the bit lines 332 are electrically connected to others of the sense amplifiers 306a-306d and 306f-306n via the interconnect material 324 (FIG. 3D), the interconnect material 322 (FIG. 3C), and the interconnect material 320 (FIG. 3B). FIG. 3D also illustrates the PMOS source interconnect line 326 and the NMOS source interconnect line 328. As discussed above, the PMOS source interconnect line 326 and the NMOS source interconnect line 328 also extend through the interconnect material 320 of FIG. 4B.

In some embodiments an apparatus includes a cross-coupled pair of pull-up transistors of a sense amplifier, a cross-coupled pair of pull-down transistors of the sense amplifier, a pair of conductive lines electrically connecting the cross-coupled pair of pull-up transistors to the cross-coupled pair of pull-down transistors, and sense amplifier control transistors sharing a continuous active material with one of the cross-coupled pair of pull-up transistors or the cross-coupled pair of pull-down transistors.

Figure 5:
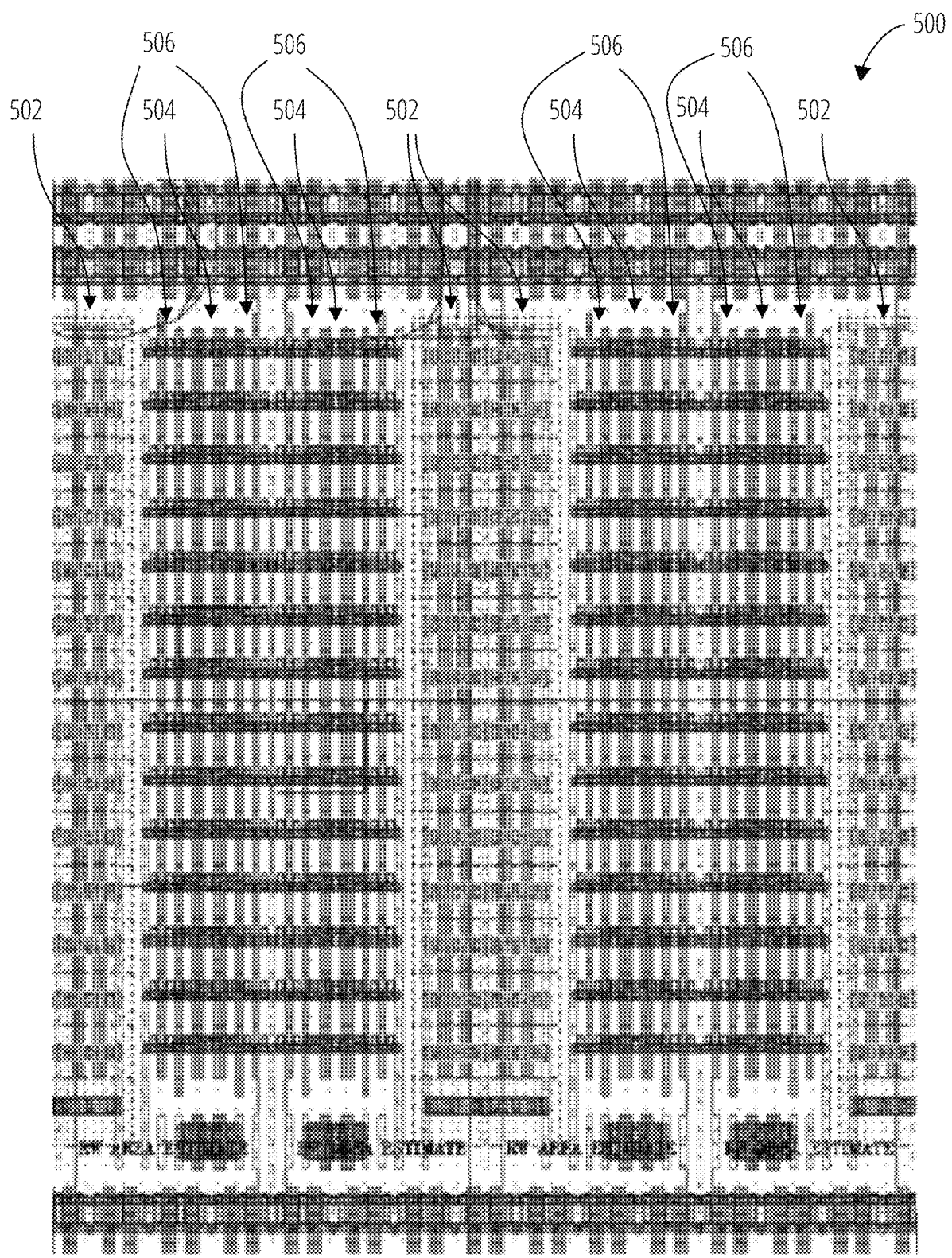
FIG. 5 is a top view of a layout design for another integrated circuit device portion, according to some embodiments.

FIG. 5 is a top view of a layout design for another integrated circuit device portion 500, according to some embodiments. The integrated circuit device portion 500 includes fifty-six sense amplifiers. For example, the integrated circuit device portion 500 includes fifty-six cross-coupled pairs of pull-up transistors 502, fifty-six cross-coupled pairs of pull-down transistors 504, and fifty-six sets of sense amplifier control transistors 506. The integrated circuit device portion 500 may include four sets of fourteen sense amplifiers, with each set of fourteen sense amplifiers similar to the fourteen sense amplifiers 306a-306n of FIG. 3A. The fifty-six sense amplifiers may each be similar to the sense amplifier 100 of FIG. 1 or the sense amplifier 200 of FIG. 2, and may each be electrically connected to a pair of bit lines (e.g., the bit lines DL and DLF of FIG. 1 and FIG. 2). As a result, the integrated circuit device portion 500 may be electrically connected to fifty-six pairs of bit lines, each of which may be electrically connected to multiple memory cells.

Although the layout designs illustrated in FIG. 3A and FIG. 5 include sense amplifiers having cross-coupled pairs of pull-down transistors sharing a continuous active material (e.g., a continuous fin) with four sense amplifier control transistors per each sense amplifier, in some embodiments a cross-coupled pair of transistors may share a continuous active material with more or less than four sense amplifier control transistors. By way of non-limiting example, although not shown, the seventh NMOS transistor N7 may share the continuous active material with the cross-coupled pair of pull-down transistors and the sense amplifier control transistors. In such non-limiting examples seven transistors may share the continuous active material.

In FIG. 5 gate material lines for the cross-coupled pairs of pull-up transistors and the cross-coupled pairs of pull-down transistors are shown as extending continuously through fourteen sense amplifiers in order to reduce the complexity of FIG. 5. It should be noted, however, that breaks in the gate terminal lines for the cross-coupled pairs of pull-up transistors and the cross-coupled pairs of pull-down transistors may be provided between each sense amplifier, as illustrated in FIG. 3A and FIG. 4A.

FIG. 6 is a perspective view of a FinFET 600, according to some embodiments. As previously discussed, cross-coupled pairs of pull-up transistors (e.g., the cross-coupled pair of pull-up transistors 102 of FIG. 1 and FIG. 2, the cross-coupled pairs of pull-up transistors 302 of FIG. 3A, the cross-coupled pair of pull-up transistors 402 of FIG. 4A, the cross-coupled pairs of pull-up transistors 502 of FIG. 5), cross-coupled pairs of pull-down transistors (e.g., the cross-coupled pair of pull-down transistors 104 of FIG. 1 and FIG. 2, the cross-coupled pairs of pull-down transistors 304 of FIG. 3A, the cross-coupled pair of pull-down transistors 404 of FIG. 4A, the cross-coupled pairs of pull-down transistors 504 of FIG. 5), sense amplifier control transistors (e.g., the sense amplifier control transistors 108 of FIG. 1 and FIG. 2, the sets of sense amplifier control transistors 308 of FIG. 3A, the sense amplifier control transistors 406 of FIG. 4A, the sets of sense amplifier control transistors 506 of FIG. 5), or combinations thereof may include FinFETs. As a result, in some embodiments the cross-coupled pairs of pull-up transistors, the cross-coupled pairs of pull-down transistors, the sets of sense amplifier control transistors, or combinations thereof may be similar to the FinFET 600 of FIG. 6.

The FinFET 600 is formed on an insulative material 610 (e.g., silicon dioxide). The FinFET 600 includes a source/drain terminal 602, a source/drain terminal 604, a fin 608 including active material extending from the source/drain terminal 602 to the source/drain terminal 604, and a gate terminal 606 over the fin 608.

FIG. 7 is a perspective view of FinFETs 700 sharing a continuous active material, according to some embodiments. As previously discussed, cross-coupled pairs of transistors of various sense amplifiers disclosed herein may share, with each other, a continuous active material. Also, cross-coupled pairs of transistors of various sense amplifiers disclosed herein may share a continuous active material with sense amplifier control transistors (e.g., the cross-coupled pair of pull-down transistors 404 share a continuous active material 310 with the sense amplifier control transistors 406 of FIG. 4A). FIG. 7 illustrates an example of a continuous active material (e.g., a continuous fin 708) extending through multiple FinFETs 700.

For example, the FinFETs 700 include gate terminals 712, 714, 716, and 718 and source/drain terminals 702, 704, and 706 formed on an insulative material 710. The continuous fin 708 extends through the gate terminals 712, 714, 716, and 718 and the source/drain terminals 702, 704, and 706 of the multiple FinFETs 700.

The FinFETs 700 also illustrates a metal interconnect 720 electrically connecting the source/drain terminal 704 to the gate terminal 716 (e.g., for a cross-coupled pair of transistors of a sense amplifier according to various embodiments disclosed herein).

Although the FinFETs 700 shown in FIG. 7 only include four transistors sharing a common fin 708, embodiments disclosed herein may include six transistors sharing a common fin, such as the cross-coupled pair of pull-down transistors 404 and the sense amplifier control transistors 406 (NMOS transistors N1-N6) illustrated in FIG. 4A. In the interest of simplicity, FIG. 7 only illustrates four transistors sharing the common fin 708.

Figure 8:
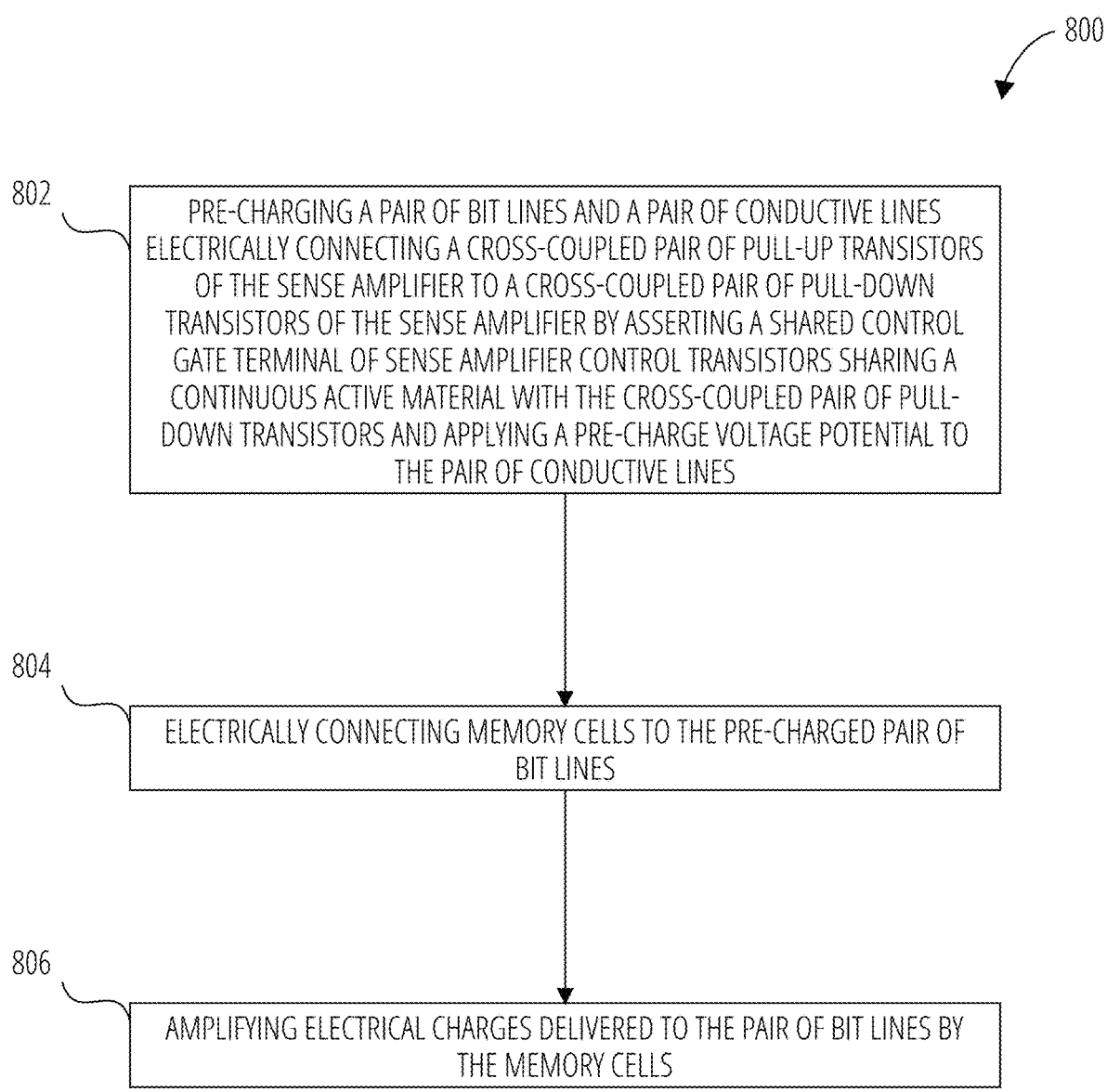
FIG. 8 is a flowchart illustrating a method of operating a sense amplifier (e.g., the sense amplifiers of FIG. 1, FIG. 2, FIG. 4A, or FIG. 5), according to some embodiments.

FIG. 8 is a flowchart illustrating a method 800 of operating a sense amplifier (e.g., the sense amplifier 100 of FIG. 1, the sense amplifier 200 of FIG. 2, the sense amplifier 306e of FIG. 4A or sense amplifiers of FIG. 5), according to some embodiments. At operation 802 the method 800 includes pre-charging a pair of bit lines (e.g., the bit lines DL, DLF of FIG. 1, FIG. 2, or FIG. 4D) and a pair of conductive lines (e.g., the pair of conductive lines 106 of FIG. 1 or FIG. 2, or any of the pairs of conductive lines 330a-330n of FIG. 3C) electrically connecting a cross-coupled pair of pull-up transistors (e.g., the cross-coupled pair of pull-up transistors 102 of FIG. 1 or FIG. 2 or any of the cross-coupled pairs of pull-up transistors 302 of FIG. 3A) of the sense amplifier (e.g., the sense amplifier 100 of FIG. 1, the sense amplifier 200 of FIG. 2, any of the sense amplifiers 306a-306n of FIG. 3A) to a cross-coupled pair of pull-down transistors (e.g., the cross-coupled pair of pull-down transistors 104 of FIG. 1 or FIG. 2, any of the cross-coupled pairs of pull-down transistors 304 of FIG. 3A) of the sense amplifier by asserting a shared control gate terminal (e.g., the gate material lines 312) of sense amplifier control transistors (e.g., the sense amplifier control transistors 108 of FIG. 1 or FIG. 2, or any of the sets of sense amplifier control transistors 308 of FIG. 3A) sharing a continuous active material (e.g., the continuous active material 310 of FIG. 3A and FIG. 4A) with the cross-coupled pair of pull-down transistors and applying a pre-charge voltage potential to the pair of conductive lines.

In some embodiments applying the pre-charge voltage potential to the pair of conductive lines includes asserting a gate terminal of a pre-charge transistor (e.g., the seventh NMOS transistor N7 of FIG. 1) electrically connected between a pre-charge voltage potential node (e.g., the pre-charge voltage potential node VBLP of FIG. 1) and at least one conductive line of the pair of conductive lines (e.g., the pair of conductive lines 106 of FIG. 1, any one of the pairs of conductive lines 330a-330n of FIG. 3C). In some embodiments applying the pre-charge voltage potential to the pair of conductive lines includes asserting a gate terminal of a pre-charge transistor (e.g., the seventh NMOS transistor N7 of FIG. 2) electrically connected between a pre-charge voltage potential node (e.g., the pre-charge voltage potential node VBLP of FIG. 2) and at least one bit line (e.g., the bit line DLF of FIG. 2, any of the bit lines 332 of FIG. 3D and FIG. 4D) of the pair of bit lines, and conducting, through the sense amplifier control transistors, the pre-charge voltage potential from the at least one bit line to the pair of conductive lines.

At operation 804 the method 800 includes electrically connecting memory cells to the pre-charged pair of bit lines. At operation 806 the method 800 includes amplifying, using the sense amplifier, electrical charges delivered to the pair of bit lines by the memory cells.

In some embodiments a method of operating a sense amplifier includes pre-charging a pair of bit lines and a pair of conductive lines electrically connecting a cross-coupled pair of pull-up transistors of the sense amplifier to a cross-coupled pair of pull-down transistors of the sense amplifier by asserting a shared control gate terminal of sense amplifier control transistors sharing a continuous active material with the cross-coupled pair of pull-down transistors and applying a pre-charge voltage potential to the pair of conductive lines. The method also includes electrically connecting memory cells to the pre-charged pair of bit lines and amplifying electrical charges delivered to the pair of bit lines by the memory cells.

Figure 9:
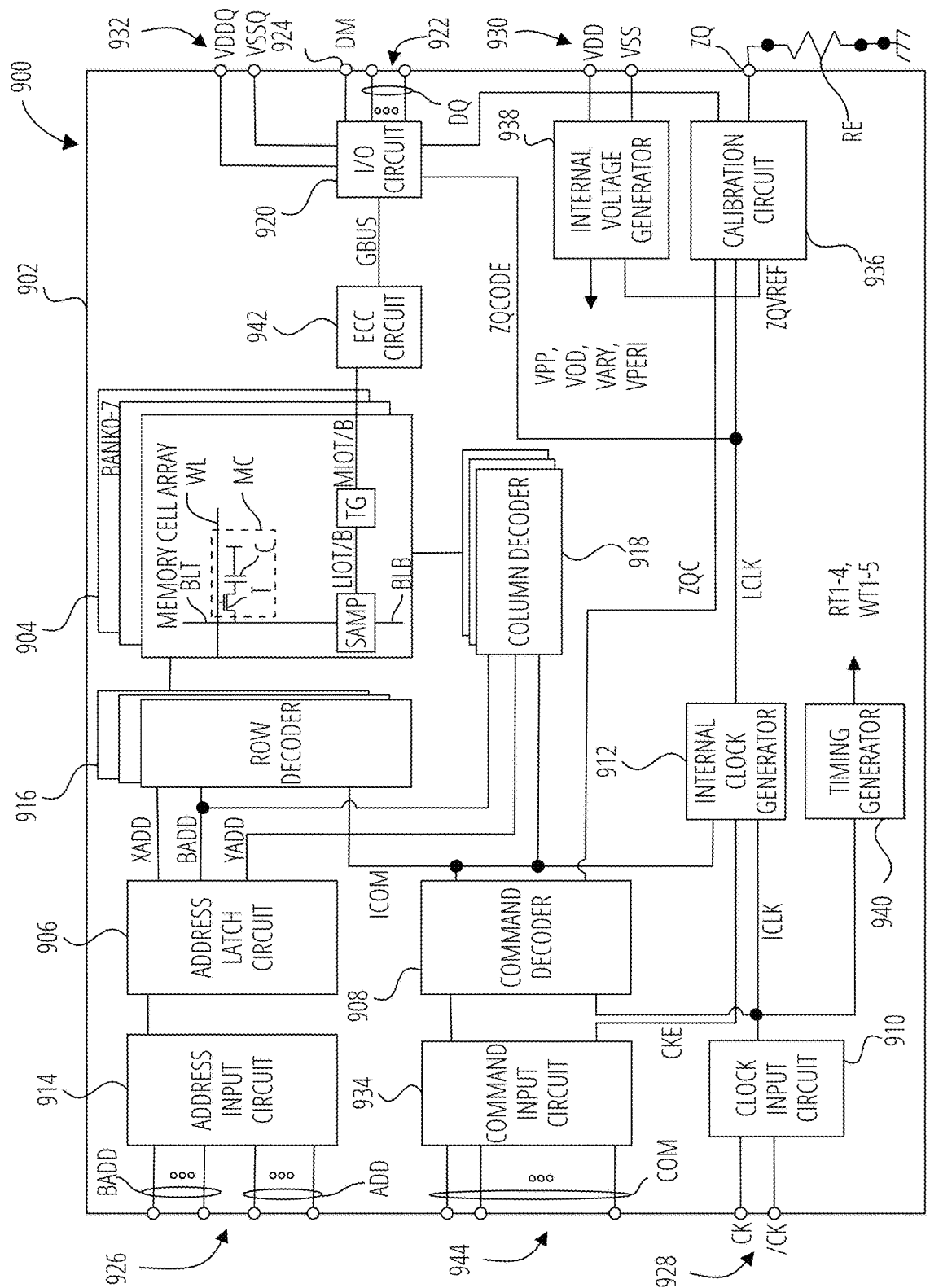
FIG. 9 is a block diagram of a semiconductor device, according to some embodiments.

FIG. 9 is a block diagram of a semiconductor device 900, according to some embodiments. By way of non-limiting example, the semiconductor device 900 according to the embodiment is a DRAM of DDR4 (Double Data Rate 4) type integrated on a single semiconductor chip, and is mounted on a substrate 902. The substrate 902 is a memory module substrate or a motherboard, and is provided with a resistor RE. The resistor RE is connected to a calibration terminal ZQ of the semiconductor device 900, and impedance thereof is used as a reference impedance of a calibration circuit 936. In the embodiment, the resistor RE is supplied with a ground potential VSS.

As shown in FIG. 9, the semiconductor device 900 has a memory cell array 904. The memory cell array 904 is divided into eight banks BANK0 to BANK7. Each of the banks BANK0 to BANK7 is provided with a plurality of word lines WL and a plurality of bit lines BLT, BLB, and a memory cell MC is disposed at an intersection of these lines. By way of non-limiting example, the memory cell MC may be a DRAM cell having a cell transistor T and a memory cell capacitor C connected in series with the cell transistor T.

Selection of the word line WL is performed by a row decoder 916, while selection of the bit line BL is performed by a column decoder 918. As shown in FIG. 9, the row decoder 916 and the column decoder 918 are provided for each of BANK0 to BANK7.

The bit lines BLT, BLB pair is connected to a sense amplifier SAMP. Read data read from the bit line BLT or the bit line BLB is amplified by the sense amplifier SAMP, and thereafter transferred to an ECC control circuit 942 via complementary local data lines LIOT/LIOB, a switch circuit (transfer gate) TG, and complementary main data lines MIOT/MIOB. The ECC control circuit 942 is also provided for each of BANK0 to BANK7. The memory cell array 904 may include multiple pairs of bit lines BLB, BLP electrically connected to multiple instances of sense amplifier SAMP. Each pair of bit lines BLB, BLP may be similar to the bit lines DL, DLF discussed above with reference to FIG. 1, FIG. 2, and FIG. 4D, and the bit lines 332 of FIG. 3D and FIG. 4D. Also, each instance of the sense amplifier SAMP may be similar to the sense amplifier 100 of FIG. 1, the sense amplifier 200 of FIG. 2, the sense amplifiers 306a-306n of FIG. 3A, and/or the sense amplifiers of the integrated circuit device portion 500 of FIG. 5. Accordingly, the sense amplifiers SAMP may be laid out according to the sense amplifier layout designs disclosed herein (e.g., the layout design for the integrated circuit device portion 300 of FIG. 3A-FIG. 3D, the layout design for the integrated circuit device portion 500 of FIG. 5).

When the read data is read from the memory cell array 904, a parity is also simultaneously read. Conversely, write data outputted from the ECC control circuit 942 is transferred to the sense amplifier SAMP via the complementary main data lines MIOT/MIOB, the switch circuit TG, and the complementary local data lines LIOT/LIOB, and written in the memory cell MC connected to the bit line BLT or the bit line BLB. The write data is written in the memory cell array 904, and a parity is also simultaneously written.

Further, the semiconductor device 900 is provided with an address terminal 926, a command terminal 944, a clock terminal 928, a data terminal 922, a data mask terminal 924, voltage terminal 930, voltage terminal 932, and a calibration terminal ZQ as external terminals.

The address terminal 926 is a terminal into which an address signal ADD and a bank address signal BADD are inputted from outside. The address signal ADD inputted in the address terminal 926 is supplied to an address latch circuit 906 via an address input circuit 914, and latched therein. Of signals latched by the address latch circuit 906, a row address signal XADD and a bank address signal BADD are supplied to the row decoder 916, while a column address signal YADD and the bank address signal BADD are supplied to the column decoder 918.

One of row decoder 916 corresponding to BANK0 to BANK7 is selected on the basis of the bank address signal BADD, and selects a predetermined word line WL on the basis of the row address signal XADD. One of column decoder 918 corresponding to BANK0 to BANK7 is selected on the basis of the bank address signal BADD, and selects a predetermined sense amplifier SAMP on the basis of the column address signal YADD.

The command terminal 944 is a terminal into which a command signal COM is inputted from outside. The command signal COM inputted in the command terminal 944 is supplied to a command decoder 908 via a command input circuit 934. The command decoder 908 is a circuit decoding the command signal COM and thereby generating various internal commands ICOM. The internal commands ICOM are supplied to the row decoder 916, the column decoder 918, a timing generator 940, and the like.

For example, if an active command and a read command are inputted as the command signals COM, and, in synchronism therewith, the row address XADD and the column address YADD are inputted, read data and a parity are read from the memory cell MC designated by these row address XADD and column address YADD. The read data and parity are inputted into the ECC control circuit 942, and if an error bit is contained in the read data, the read data is corrected. The corrected read data DQ is burst-outputted from the data terminal 922 to outside via a data input/output circuit 920. Though not particularly limited, the embodiment is provided with eight terminals of the data terminal 922 (DQ0 to DQ7), and, during read operation, read data of 8 bits DQ is burst-outputted from each terminal of the data terminal 922. Accordingly, read data of 64 bits DQ is outputted in one read operation.

On the other hand, if an active command and a write command are inputted as the command signals COM, in synchronism therewith, the row address XADD and the column address YADD are inputted, and thereafter write data DQ is burst-inputted into the data terminal 922, the write data DQ is supplied to the ECC control circuit 942 via the data input/output circuit 920, and a parity is generated on the basis of the write data. The write data and the parity are supplied to the memory cell array 904, and written into the memory cell MC designated by the row address XADD and the column address YADD. As described above, when eight terminals of the data terminal 922 are provided and the burst number is eight bits, write data of 64 bits DQ is inputted in one write operation.

During the write operation, a data mask signal DM may be inputted into the data mask terminal 924. If the data mask signal DM is inputted, corresponding burst data of the write data DQ to be burst-inputted is masked.

External clock signals CK,/CK are inputted into the clock terminal 928. The external clock signal CK and the external clock signal/CK are signals complementary to each other, and both the external clock signals are supplied to the clock input circuit 910. The clock input circuit 910 generates an internal clock signal ICLK on receipt of the external clock signals CK,/CK. The internal clock signal ICLK is supplied to an internal clock generator 912, and thereby a phase-controlled internal clock signal LCLK is generated. Though not particularly limited, a DLL circuit can be used as the internal clock generator 912. The phase-controlled internal clock signal LCLK is supplied to the data input/output circuit 920, and used as a timing signal determining an output timing of the read data DQ. It should be noted that the internal clock generator 912 is activated in response to a clock enable signal CKE that is one of the command signals COM.

The internal clock signal ICLK is also supplied to the timing generator 940, and thereby a plurality of timing signals RT1 to RT4, WT1 to WT5 are generated. The timing signals RT1 to RT4, WT1 to WT5 generated by the timing generator 940 are supplied to the ECC control circuit 942, and define operation timings of the ECC control circuit 942 during the read operation and during the write operation, respectively.

The voltage terminal 930 is a terminal supplied with voltage potentials VDD, VSS. The voltage potentials VDD, VSS supplied to the voltage terminal 930 are supplied to the internal voltage generator 938. The internal voltage generator 938 generates various internal potentials VPP, VOD, VARY, VPERI, and a reference potential ZQVREF on the basis of the voltage potentials VDD, VSS. The internal potential VPP is a potential mainly used in the row decoder 916, the internal potentials VOD, VARY are potentials used in the sense amplifier SAMP in the memory cell array 904, and the internal potential VPERI is a potential used in many other circuit blocks. On the other hand, the reference potential ZQVREF is a reference potential used in the calibration circuit 936.

The voltage terminal 932 is a terminal supplied with voltage potentials VDDQ, VSSQ. The voltage potentials VDDQ, VSSQ supplied to the voltage terminal 932 are supplied to the data input/output circuit 920. The voltage potentials VDDQ, VSSQ are the same potential as the voltage potentials VDD, VSS supplied to the voltage terminal 930, respectively, but, in order to prevent voltage noise caused by the data input/output circuit 920 from propagating to the other circuit blocks, the voltage potentials VDDQ, VSSQ dedicated to the data input/output circuit 920 are used.

The calibration terminal ZQ is connected to the calibration circuit 936. When being activated by a calibration signal ZQC, the calibration circuit 936 performs a calibration operation with reference to the impedance of the resistor RE and the reference potential ZQVREF. An impedance code ZQCODE obtained by the calibration operation is supplied to the data input/output circuit 920, and thereby the impedance of an output buffer (not shown) included in the data input/output circuit 920 is designated.

Figure 10:
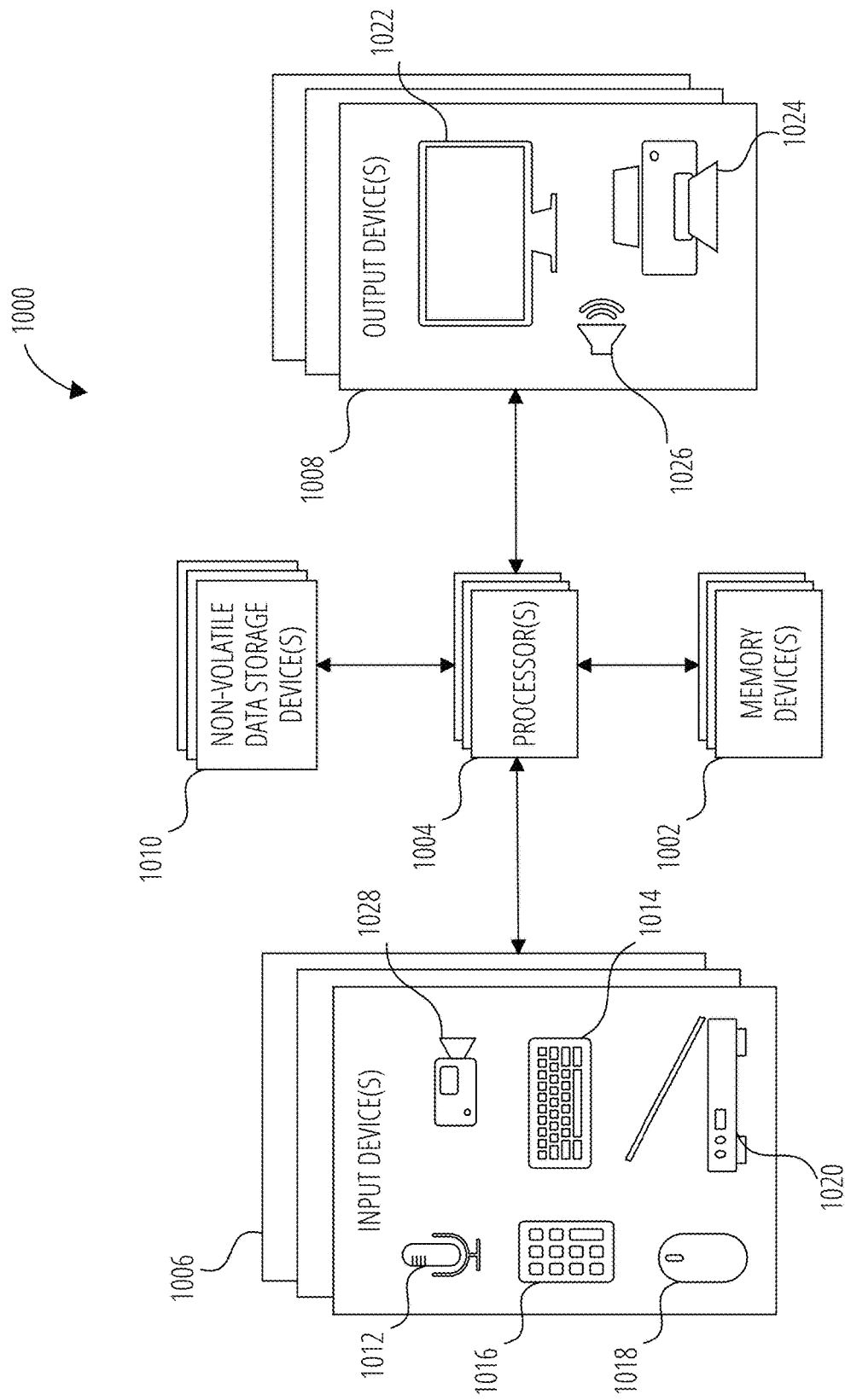
FIG. 10 is a block diagram of a computing system, according to some embodiments.

FIG. 10 is a block diagram of a computing system 1000, according to some embodiments. The computing system 1000 includes one or more processors 1004 operably coupled to one or more memory devices 1002, one or more non-volatile data storage devices 1010, one or more input devices 1006, and one or more output devices 1008. In some embodiments the computing system 1000 includes a personal computer (PC) such as a desktop computer, a laptop computer, a tablet computer, a mobile computer (e.g., a smartphone, a personal digital assistant (PDA), without limitation), a network server, or other computer device.

In some embodiments the one or more processors 1004 may include a central processing unit (CPU) or other processor configured to control the computing system 1000. In some embodiments the one or more memory devices 1002 include random access memory (RAM), such as volatile data storage (e.g., dynamic RAM (DRAM) static RAM (SRAM), without limitation). In some embodiments the one or more non-volatile data storage devices 1010 include a hard drive, a solid state drive, Flash memory, erasable programmable read only memory (EPROM), other non-volatile data storage devices, or any combination thereof. In some embodiments the one or more input devices 1006 include a keyboard 1014, a pointing device 1018 (e.g., a mouse, a track pad, without limitation), a microphone 1012, a keypad 1016, a scanner 1020, a camera 1028, other input devices, or any combination thereof. In some embodiments the output devices 1008 include an electronic display 1022, a speaker 1026, a printer 1024, other output devices, or any combination thereof.

In some embodiments the one or more memory devices 1002 include sense amplifiers according to various embodiments disclosed herein. By way of non-limiting example, the one or more memory devices 1002 may include the sense amplifier 100 of FIG. 1, the sense amplifier 200 of FIG. 2, the integrated circuit device portion 300 of FIG. 3A-FIG. 3D, the integrated circuit device portion 500 of FIG. 5, or combinations thereof. Also by way of non-limiting example, the one or more memory devices 1002 may be configured to perform the method 800 of FIG. 8.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, without limitation) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to,").

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C," or "one or more of A, B, and C," is used, in general such a construction is intended to include A alone, B alone, C alone, A and B together, A and C together, B and C together, or A, B, and C together.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
    a cross-coupled pair of pull-up transistors of a sense amplifier;
    a cross-coupled pair of pull-down transistors of the sense amplifier;
    a pair of conductive lines electrically connecting the cross-coupled pair of pull-up transistors to the cross-coupled pair of pull-down transistors; and
    sense amplifier control transistors sharing a continuous active material with one of the cross-coupled pair of pull-up transistors or the cross-coupled pair of pull-down transistors, the pair of conductive lines extending at least substantially in parallel with the continuous active material.

2. The apparatus of claim 1, wherein the sense amplifier control transistors share the continuous active material with the cross-coupled pair of pull-down transistors.

3. The apparatus of claim 1, wherein the cross-coupled pair of pull-up transistors and the cross-coupled pair of pull-down transistors are fin field effect transistors (Fin-FETs).

4. The apparatus of claim 3, wherein:
the sense amplifier control transistors are FinFETs; and
the sense amplifier control transistors share a common fin with the cross-coupled pair of pull-down transistors.

5. The apparatus of claim 1, wherein the cross-coupled pair of pull-up transistors share a common fin.

6. The apparatus of claim 1, wherein the pair of conductive lines extends at least substantially perpendicularly to bit lines the sense amplifier is electrically connected to.

7. The apparatus of claim 1, wherein the cross-coupled pair of pull-down transistors includes source terminals that are electrically connected to other source terminals of other cross-coupled pairs of pull-down transistors of other sense amplifiers.

8. The apparatus of claim 1, wherein the cross-coupled pair of pull-up transistors includes source terminals that are electrically connected to other source terminals of other cross-coupled pairs of pull-up transistors of other sense amplifiers.

9. The apparatus of claim 1, further comprising a pre-charge transistor electrically connected from a pre-charge voltage potential node to a bit line electrically connected to the sense amplifier or to one of the pair of conductive lines.

10. An apparatus, comprising:
a cross-coupled pair of pull-up transistors of a sense amplifier;
a cross-coupled pair of pull-down transistors of the sense amplifier;
a pair of conductive lines electrically connecting the cross-coupled pair of pull-up transistors to the cross-coupled pair of pull-down transistors; and
sense amplifier control transistors sharing a continuous active material with one of the cross-coupled pair of pull-up transistors or the cross-coupled pair of pull-down transistors, gate material lines of control gate terminals of the sense amplifier control transistors shared with other control gate terminals of other sense amplifier control transistors of other sense amplifiers.

11. The apparatus of claim 10, wherein the gate material lines of the control gate terminals of the sense amplifier control transistors extend at least substantially perpendicularly to the pair of conductive lines.

12. A method of operating a sense amplifier, the method comprising:
pre-charging a pair of bit lines and a pair of conductive lines electrically connecting a cross-coupled pair of pull-up transistors of the sense amplifier to a cross-coupled pair of pull-down transistors of the sense amplifier by asserting a shared control gate terminal of sense amplifier control transistors sharing a continuous active material with the cross-coupled pair of pull-down transistors and applying a pre-charge voltage potential to the pair of conductive lines, wherein the pair of conductive lines extend at least substantially in parallel with the continuous active material;
electrically connecting memory cells to the pre-charged pair of bit lines; and
amplifying electrical charges delivered to the pair of bit lines by the memory cells.

13. The method of claim 12, wherein applying the pre-charge voltage potential to the pair of conductive lines comprises asserting a gate terminal of a pre-charge transistor electrically connected between a pre-charge voltage potential node and at least one conductive line of the pair of conductive lines.

14. The method of claim 13, wherein applying the pre-charge voltage potential to the pair of conductive lines comprises:
asserting a gate terminal of a pre-charge transistor electrically connected between a pre-charge voltage potential node and at least one bit line of the pair of bit lines; and
conducting, through the sense amplifier control transistors, the pre-charge voltage potential from the at least one bit line to the pair of conductive lines.

15. An apparatus, comprising:
a first sense amplifier including:
a first cross-coupled pair of pull-up transistors;
a first cross-coupled pair of pull-down transistors; and
a first set of sense amplifier control transistors sharing a first continuous active material with the first cross-coupled pair of pull-down transistors; and
a second sense amplifier including:
a second cross-coupled pair of pull-up transistors;
a second cross-coupled pair of pull-down transistors; and
a second set of sense amplifier control transistors sharing a second continuous active material with the second cross-coupled pair of pull-down transistors.

16. The apparatus of claim 15, wherein first source terminals of the first cross-coupled pair of pull-up transistors are electrically connected to second source terminals of the second cross-coupled pair of pull-up transistors.

17. The apparatus of claim 15, wherein first source terminals of the first cross-coupled pair of pull-down transistors are electrically connected to second source terminals of the second cross-coupled pair of pull-down transistors.

18. The apparatus of claim 15, wherein first gate terminals of the first set of sense amplifier control transistors share common gate material lines with second gate terminals of the second set of sense amplifier control transistors.

19. The apparatus of claim 15, further comprising a third sense amplifier including:
a third cross-coupled pair of pull-up transistors;
a third cross-coupled pair of pull-down transistors; and
a third set of sense amplifier control transistors sharing a third continuous active material with the third cross-coupled pair of pull-down transistors.

* * * * *

UNITED STATES PATENT AND TRADEMARK OFFICE
CERTIFICATE OF CORRECTION

PATENT NO. : 11,948,657 B2
APPLICATION NO. : 17/547574
DATED : April 2, 2024
INVENTOR(S) : Christopher G. Wieduwilt and Eric J. Schultz Page 1 of 1

It is certified that error appears in the above-identified patent and that said Letters Patent is hereby corrected as shown below:

On the Title Page
Column 2,  change "*Primary Examiner* – Huan Hoang" to
--*Primary Examiner* – Huan Hoang
*Examiner* – Minh D Dinh--

In the Specification
Column 4,  Line 24,  change "oxide (NbO—$_x$—)," to --oxide (NbO$_x$),--
Column 4,  Line 35,  change "HfO$_x$, NbO—$_x$, TiO$_x$," to --HfO$_x$, NbO$_x$, TiO$_x$,--
Column 20, Line 8,   change "signals CK,/CK are" to --signals CK, /CK are--
Column 20, Line 10,  change "signal/CK are" to --signal /CK are--
Column 20, Line 14,  change "signals CK,/CK." to --signals CK, /CK.--

Signed and Sealed this
Ninth Day of July, 2024

Katherine Kelly Vidal
*Director of the United States Patent and Trademark Office*